United States Patent
Barth, Jr. et al.

(10) Patent No.: US 9,466,614 B2
(45) Date of Patent: Oct. 11, 2016

(54) VERTICALLY INTEGRATED MEMORY CELL

(71) Applicant: International Business Machines Corporation, Armonk, NY (US)

(72) Inventors: John E. Barth, Jr., Williston, VT (US); Babar A. Khan, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 14/289,679

(22) Filed: May 29, 2014

(65) Prior Publication Data
US 2015/0348977 A1    Dec. 3, 2015

(51) Int. Cl.
| | |
|---|---|
| *H01L 21/00* | (2006.01) |
| *H01L 27/12* | (2006.01) |
| *H01L 21/84* | (2006.01) |
| *H01L 29/66* | (2006.01) |
| *H01L 27/108* | (2006.01) |

(52) U.S. Cl.
CPC ........... *H01L 27/1203* (2013.01); *H01L 21/84* (2013.01); *H01L 27/10841* (2013.01); *H01L 27/10864* (2013.01); *H01L 29/66181* (2013.01)

(58) Field of Classification Search
CPC .................... H01L 27/10864; H01L 27/10841
See application file for complete search history.

(56) References Cited

U.S. PATENT DOCUMENTS

| | | |
|---|---|---|
| 6,921,935 B2 | 7/2005 | Brown |
| 7,276,751 B2 * | 10/2007 | Ho ........................ H01L 28/91 257/296 |
| 7,488,641 B2 | 2/2009 | Noble |
| 7,759,191 B2 | 7/2010 | Cheng et al. |
| 7,768,051 B2 | 8/2010 | Abbott |
| 7,989,866 B2 | 8/2011 | Abbott et al. |
| 8,274,106 B2 | 9/2012 | Abbott et al. |
| 8,637,365 B2 | 1/2014 | Cheng et al. |

OTHER PUBLICATIONS

Khan et al., "Activation Energy of Source-Drain Current in Hydrogenated and Unhydrogenated Polysilicon Thin-Film Transistors", IEEE Transactions on Electron Devices. vol. 37. No. 7. July 1990, pp. 1727-1734.

* cited by examiner

*Primary Examiner* — Richard Booth
(74) *Attorney, Agent, or Firm* — L. Jeffrey Kelly; Steven Meyers

(57) ABSTRACT

A vertically integrated memory cell including a deep trench extending into a substrate, a trench capacitor located within the deep trench, and a vertical transistor at least partially embedded within the deep trench above the trench capacitor, the vertical transistor is in direct contact with and electrically coupled to the trench capacitor.

20 Claims, 9 Drawing Sheets

VERTICALLY INTEGRATED MEMORY CELL

BACKGROUND

The present invention relates generally to semiconductor memory devices, and, more particularly, to a vertically integrated DRAM cell in which a transistor may be positioned directly above and vertically aligned to a deep trench capacitor.

A DRAM cell may typically include a deep trench capacitor electrically coupled to a transistor. In general, a capacitor may include two electrodes separated by some barrier (e.g. node dielectric) used to isolate the two electrodes from one another. A deep trench capacitor may typically be formed in a semiconductor-on-insulator substrate. The semiconductor-on-insulator substrate may have an SOI layer stacked on top of a buried oxide layer and the buried oxide layer stacked on top of a base substrate. The base substrate generally being n-doped silicon and the SOI layer generally being p-doped silicon, or vice versa. A pad layer or hardmask may also be located atop the semiconductor-on-insulator substrate. The deep trench capacitor may be formed through the pad layer and into all layers of the semiconductor-on-insulator substrate. In such cases, the base substrate may act as one of the capacitor's two electrodes while a conductive layer or an inner electrode may act as the other electrode.

The transistor may include a typical field effect transistor which may be positioned on the SOI layer and adjacent to the deep trench capacitor. The transistor may be electrically coupled to the deep trench capacitor using a strap. More specifically, the inner electrode of the deep trench capacitor may typically be electrically coupled to a source-drain region of the transistor.

SUMMARY

According to an embodiment of the present invention, a vertically integrated memory cell is provided. The vertically integrated memory cell may include a deep trench extending into a substrate, a trench capacitor located within the deep trench, and a vertical transistor at least partially embedded within the deep trench above the trench capacitor, the vertical transistor is in direct contact with and electrically coupled to the trench capacitor.

According to another embodiment of the present invention, a vertically integrated memory cell is provided. The vertically integrated memory cell may include a deep trench extending into a substrate, the deep trench comprising a sidewall and a bottom; a trench capacitor located within the deep trench, the trench capacitor comprising a node dielectric disposed along the sidewall and the bottom of the deep trench and an inner electrode disposed on top of the node dielectric; and a vertical transistor at least partially embedded within the deep trench above the trench capacitor, the vertical transistor comprising a channel and a gate, the channel is disposed within the deep trench above and in direct contact with the inner electrode of the trench capacitor, the gate is located within the substrate and surrounds the channel.

According to another embodiment of the present invention, a vertically integrated memory cell is provided. The vertically integrated memory cell may include a deep trench extending into a semiconductor-on-insulator substrate, the deep trench comprising a sidewall and a bottom, the semiconductor-on-insulator substrate comprises an SOI layer, a buried oxide layer, and a base layer; the buried oxide layer is located below the SOI layer and above the base layer, and the buried oxide layer electrically insulates the SOI layer from the base layer, a trench capacitor located within the deep trench, the trench capacitor comprising a barrier layer disposed along an entire sidewall and the bottom of the deep trench, a dielectric layer disposed on top of the barrier layer, and an inner electrode disposed on top of the dielectric layer, an upper surface of the inner electrode is below the SOI layer, and a vertical transistor at least partially embedded within the deep trench above the trench capacitor, the vertical transistor comprising a channel and a gate, the channel is disposed within the deep trench above and in direct contact with the inner electrode of the trench capacitor, the gate is located within the substrate and surrounds the channel, and the barrier layer of the trench capacitor separates the gate from the channel.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIG. 1 depicts depositing a node dielectric and an inner electrode within a deep trench according to an exemplary embodiment.

FIG. 2 depicts recessing the node dielectric and the inner electrode to a predetermined depth according to an exemplary embodiment.

FIG. 3 depicts forming a first source-drain and a gate according to an exemplary embodiment.

FIG. 4 depicts forming a gate dielectric according to an exemplary embodiment.

FIG. 5 depicts forming a channel and a second source-drain according to an exemplary embodiment.

FIG. 6 forming a contact level dielectric, a first contact, and a second contact according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
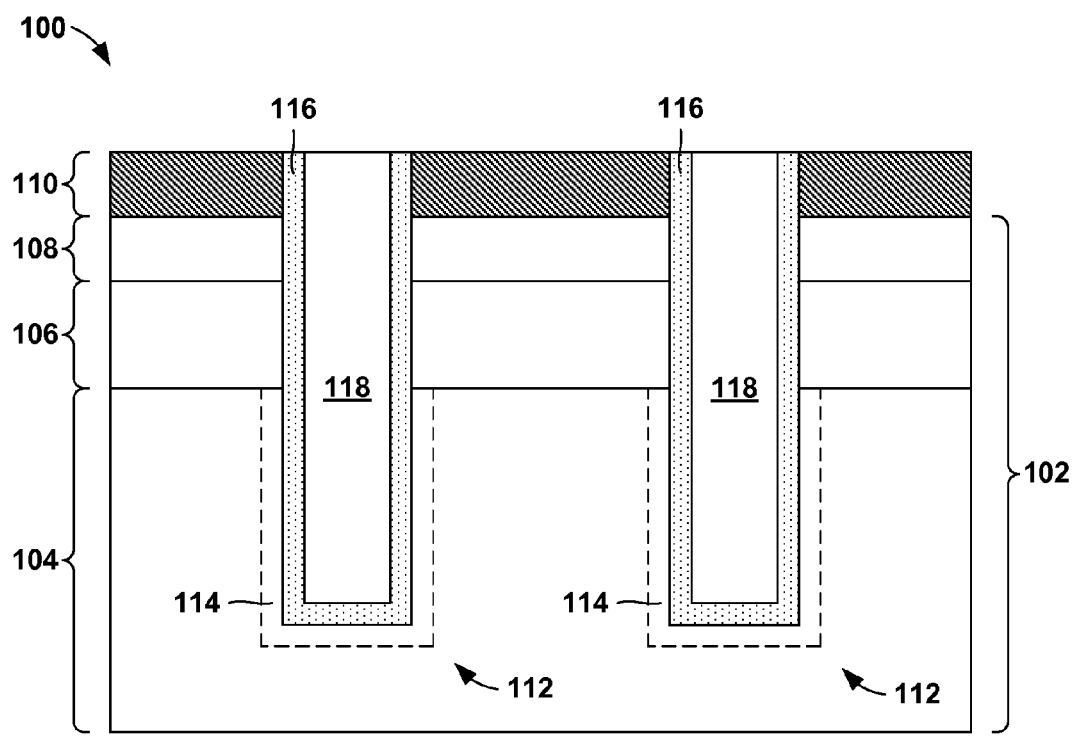
FIGS. 1-6 illustrate the steps of a method of forming a vertically integrated DRAM cell according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor memory devices, and, more particularly to, a vertically integrated DRAM cell in which a transistor may be positioned directly above and vertically aligned to a deep trench capacitor. A vertically integrated DRAM cell may reduce fabrication costs and increase device density. One way to fabricate the vertically integrate DRAM cell may include fabricating a vertical pass gate transistor partially embedded in a deep trench directly above a deep trench capacitor. One way to fabricate the vertically integrated DRAM cell is described in detail below by referring to the accompanying drawings FIGS. 1-6.

Referring now to FIGS. 1-6, exemplary process steps of forming a vertically integrated DRAM cell (hereinafter "DRAM cell") in accordance with an embodiment of the present invention are shown, and will now be described in greater detail below. It should be noted that FIGS. 1-6 all represent a cross section view of a semiconductor structure 100 ("structure") depicting the fabrication of two DRAM cells.

Referring now to FIG. 1, a deep trench may be formed in a semiconductor-on-insulator substrate 102 (hereinafter "SOI substrate"). The SOI substrate 102 may include a base substrate 104, a buried oxide layer 106 (hereinafter "BOX layer") formed on top of the base substrate 104, and an SOI layer 108 formed on top of the BOX layer 106. The BOX layer 106 electrically insulates the SOI layer 108 from the base substrate 104. In addition, the SOI substrate 102 may have a pad nitride layer 110 formed on a top surface of the SOI layer 108. The base substrate 104 may be made from any of several known semiconductor materials such as, for example, a bulk silicon substrate. Other non-limiting examples include silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 104 may be about, but is not limited to, several hundred microns thick. For example, the base substrate 104 may include a thickness ranging from 0.5 mm to about 1.5 mm.

The BOX layer 106 may be formed from any of several dielectric materials. Non-limiting examples include, for example, oxides, nitrides and oxynitrides of silicon. Oxides, nitrides and oxynitrides of other elements are also envisioned. In addition, the BOX layer 106 may include crystalline or non-crystalline dielectric material. Moreover, the BOX layer 106 may be formed using any of several methods. Non-limiting examples include ion implantation methods, thermal or plasma oxidation or nitridation methods, chemical vapor deposition methods and physical vapor deposition methods. In an embodiment, the BOX layer 106 may be about 150 nm thick. Alternatively, the BOX layer 106 may have a thickness ranging from about 10 nm to about 500 nm.

The SOI layer 108 may include any of the several semiconductor materials included in the base substrate 104. In general, the base substrate 104 and the SOI layer 108 may include either identical or different semiconducting materials with respect to chemical composition, dopant concentration and crystallographic orientation. In an embodiment, the base substrate 104 and the SOI layer 108 may include semiconducting materials that include at least different crystallographic orientations. Typically the base substrate 104 or the SOI layer 108 include a {108} crystallographic orientation and the other of the base substrate 104 or the SOI layer 108 includes a {100} crystallographic orientation. Typically, the SOI layer 108 may have a thickness ranging from about 5 nm to about 100 nm. Methods for making the SOI layer 108 are well known in the art. Non-limiting examples include SIMOX (Separation by Implantation of Oxygen), wafer bonding, and ELTRAN® (Epitaxial Layer TRANsfer).

The pad nitride layer 110 may include an insulating material such as, for example, silicon nitride. The pad nitride layer 110 may be formed using conventional deposition methods, for example, low pressure chemical vapor deposition (LPCVD), rapid thermal chemical vapor deposition (RTCVD), plasma enhanced chemical vapor deposition (PECVD), and high density plasma chemical vapor deposition (HDPCVD). The pad nitride layer 110 may have a thickness ranging from about 10 nm to about 500 nm. In an embodiment, the pad nitride layer 110 may be about 100 nm thick. Optionally, a thin (2 nm to 10 nm, preferably 5 nm) thermal oxide layer (not shown) may be formed on the SOI layer 108 prior to forming the pad nitride layer 110.

A deep trench may then be formed using known patterning techniques, such as for example, a lithography process followed by etching process. The term "deep trench" denotes a trench formed in a semiconductor substrate having a sufficient depth to form a capacitor. As such, a deep trench may typically denote a trench having a depth equal to or greater than 1 micron, whereas a shallow trench may typically refer to a trench having a depth less than 1 micron. While the present embodiment may be described with a deep trench, the present embodiment may be employed with a trench having any depth into the SOI substrate 102. Such variations are explicitly contemplated herein.

The lithography technique may include applying a photoresist (not shown) to an upper surface of the pad nitride layer 110, exposing the photoresist to a desired pattern of radiation and developing the exposed photoresist utilizing a conventional resist developer. The pattern in the photoresist may then be transferred to the pad nitride layer 110 and the SOI substrate 102 using one or more dry etching techniques to form the deep trench. Suitable dry etching techniques may include, but are not limited to: reactive ion etching (RIE), ion beam etching, plasma etching, or laser ablation. The patterned photoresist may then be removed by resist stripping after etching has been completed. In an embodiment, an optional hardmask layer, such as an oxide (not shown), may be deposited on top of the pad nitride layer 110 to facilitate the formation of the deep trench. The hardmask layer may generally be removed after the formation of the deep trench.

Next, a deep trench capacitor 112 may be formed in the deep trench according to know techniques. The deep trench capacitor 112 may include a buried plate 114, a node dielectric 116, and an inner electrode 118. The buried plate 114 and the inner electrode 118 may serve as the two electrical conductors and the node dielectric 116 may serve as the insulator between the two conductors.

An optional blanket doping technique may be used to form the buried plate 114. Suitable doping techniques may include, but are not limited to, ion implantation, gas phase doping, plasma doping, plasma immersion ion implantation, cluster doping, infusion doping, liquid phase doping, solid phase doping, or any suitable combination of those techniques. In one embodiment, dopants may be implanted by one or more rounds of angled ion implantation to dope the sidewalls and the bottom of the deep trench. In doing so, dopants may be introduced into the base substrate 104 to form the buried plate 114. Typical dopants may include As, P, Sb, B, Ga, and In. The pad nitride layer 110 may protect the top surface of the SOI layer 108 from being doped by the ion implantation. Because of the pad nitride layer 110, no special techniques may be required to mask or protect surrounding areas of the SOI layer 108 from the implantation of unwanted dopants. It should be noted that the blanket doping technique above may not be required, and in such cases the doped base substrate 104 may function as the buried plate 114.

With continued reference to FIG. 1, the node dielectric 116 may then be formed within the deep trench, and directly on the buried plate 114 and along the sidewalls of the pad nitride layer 110. The node dielectric 116 may include a dielectric material such as silicon oxide, silicon nitride, or silicon oxynitride. The thickness of the node dielectric 116 may range from about 2 nm to about 6 nm. Alternately, the node dielectric 116 may include a high-k material having a dielectric constant greater than the dielectric constant of silicon nitride, which is about 7.5. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x may independently range from about 0.5 to about 3 and each value of y may independently range from 0 to about 2. In this case, the thickness of the node dielectric 116 may range from about 2 nm to about 10 nm, although lesser and greater thickness may be contemplated. In an embodiment, the node dielectric 116 may include a combination of multiple materials. In an embodiment, the node dielectric 116 includes $HfO_x$ deposited by ALD with a thickness of about. According to an alternative embodiment, the node dielectric 116 may include more than one layer as described below with reference to FIG. 8.

Next, the inner electrode 118 may be formed by depositing a conductive or semi-conductive material on the inner walls of the node dielectric 116 according to known techniques. The inner electrode 118 may be formed by known suitable deposition techniques, for example, chemical vapor deposition (CVD), physical vapor deposition (PVD), atomic layer deposition (ALD), or low pressure chemical vapor deposition (LPCVD). The inner electrode 118 may be a doped or un-doped semiconductor material, a metal, or some combination thereof. In the present embodiment, the inner electrode 118 may be an un-doped semiconductor material, such as, for example, un-doped polysilicon. If the inner electrode 118 is a doped semiconductor material, the doped semiconductor material may include any material listed above for the base layer 104. The dopants may be a p-type dopant or an n-type dopant.

If the inner electrode 118 is an elemental metal, exemplary elemental metals may include Ta, Ti, Co, and W. Alternatively, inner electrode 118 may be a conductive metallic alloy, and exemplary conductive metallic alloys may include a mixture of elemental metals, a conductive metallic nitride such as TiN, ZrN, HfN, VN, NbN, TaN, WN, TiAlN, TaCN, and an alloy thereof. It should be noted that the inner electrode 118, while only depicted as a single layer, may include a plurality of layers of the same or different materials.

Excess material that may be deposited outside the deep trench, may be removed by a recess etch or chemical mechanical planarization. The node dielectric 116 or the pad nitride layer 110 may be used to sense an endpoint during the recess etch, or alternately, may be employed as a stopping layer during the chemical mechanical planarization.

Figure 2:
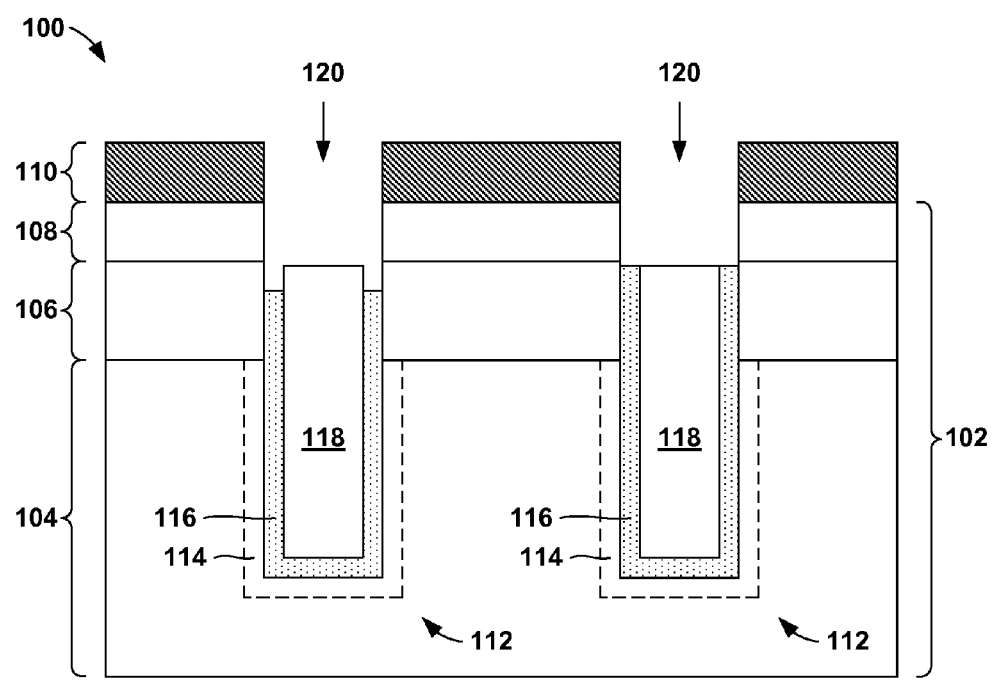

Referring now to FIG. 2, the node dielectric 116 and the inner electrode 118 may then be recessed to a predetermined depth within the buried oxide layer 106 below the SOI layer 108 to create an opening 120. However, although the exact depth is not critical, any depth below the SOI layer 108 may be sufficient. More specifically, an entire sidewall of the SOI layer 108 may preferably be exposed and the node dielectric 116 may remain above the interface between the base substrate 104 and the BOX layer 106 to prevent a short circuit between the buried plate 114 and the inner electrode 118. In one embodiment, the inner electrode 118 may be recessed such that an upper surface of the inner electrode 118 may be substantially flush with the interface between the buried oxide layer 106 and the SOI layer 108. A conventional etch process such as, for example, plasma etch, reactive ion etch (RIE), or chemical downstream etch, can be used to recess the node dielectric 116 and the inner electrode 118.

In an embodiment, the node dielectric 116 and the inner electrode 118 are recessed simultaneously using the same etching technique. In an embodiment, the node dielectric 116 and the inner electrode 118 are recessed one after the other using different etching techniques, or alternatively, the same etching technique with different chemistries. In an embodiment, the node dielectric 116 and the inner electrode 118 are both recessed using a reactive ion etching (RIE) technique.

In an embodiment, the node dielectric 116 and the inner electrode 118 may be recessed to the same depth, or about the same depth, as illustrated on the right side of the figures. In another embodiment, the node dielectric 116 and the inner electrode 118 may be recessed to different depths, as illustrated on the left side of the figures. In such cases, either the node dielectric 116 or the inner electrode 118 may be recessed deeper than the other depending on design. In all cases, the node dielectric 116 is not recessed below the buried oxide layer 106 for reasons mentioned above. If, however, the node dielectric 116 is recessed below the buried oxide layer 106, an additional insulating layer may be required to prevent a short circuit between the buried plate 114 and the inner electrode 118.

Figure 3:
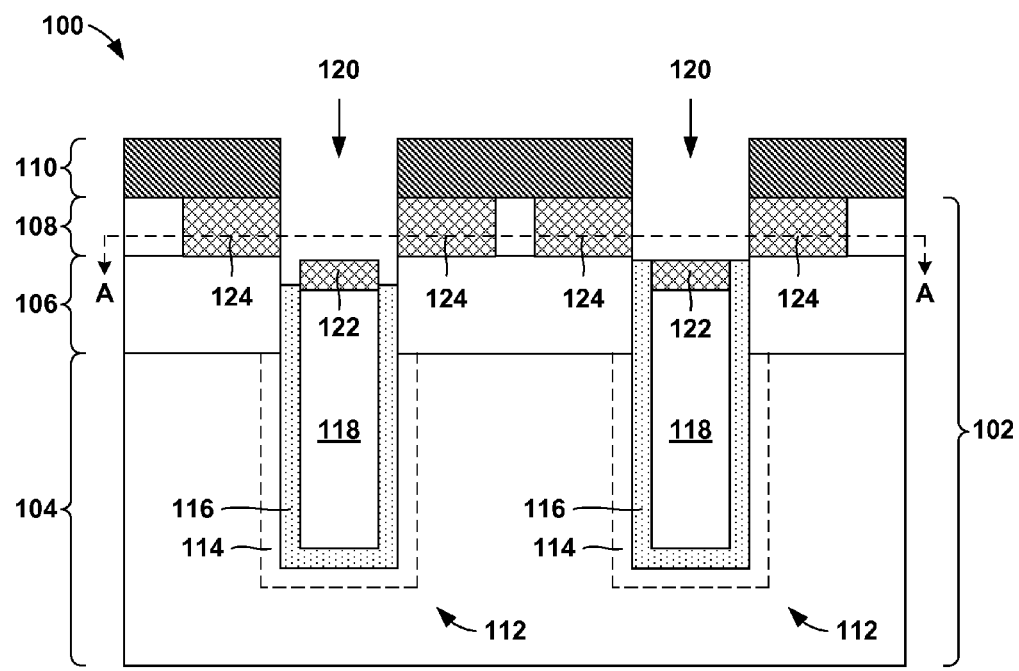
Figure 3A:
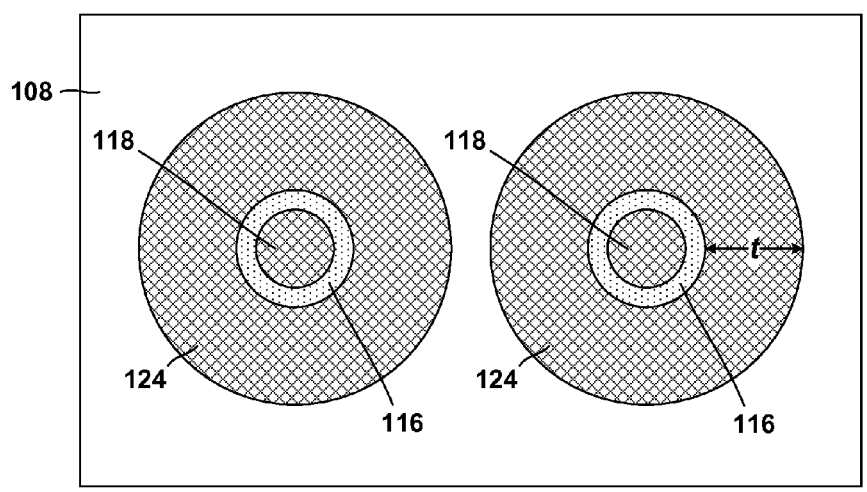
FIG. 3A illustrates a cross section view, section A-A, of FIG. 3 according to an exemplary embodiment.

Referring now to FIGS. 3 and 3A, a first source-drain 122 and a gate 124 may be formed according to known techniques, as shown. FIG. 3A is a cross section view, section A-A, of FIG. 3. In an embodiment, the first source-drain 122 and the gate 124 may be fabricated by doping an upper portion of the inner electrode 118 and a portion of the SOI layer 108 exposed within the deep trench, respectively, using any implant technique known in the art. For example, an ion implant technique may be used to introduce dopants into the upper portion of the inner electrode 118 and the portion of the SOI layer 108. More specifically, the upper portion of the inner electrode 118 exposed at a bottom of the opening 120 and the portion of the SOI layer 108 immediately surrounding the opening 120 may be doped with N-type or P-type dopants to create the first source-drain 122. It should be noted that the dopant type may be selected based on the desired device characteristics. Also, the gate 124 may preferably have a ring shape and surround the opening 120, as illustrated in FIG. 3A. It should be noted that subsequent heating or annealing techniques may cause the dopants used to create the source-drain 122 may further diffuse into a semiconductor material formed later directly on top of the source-drain 122.

According to another alternative embodiment not shown, either or both of the first source-drain 122 and the gate 124 may include a metallic material or a silicide. In general, the metallic material or the silicide may be formed in addition to and on top of the doped regions (122, 124) described above. In some instances, the doped regions (122, 124) may be recessed to accommodate the addition of the metallic material or silicide.

According to another alternative embodiment not shown, the first source-drain 122 may be formed by growing a doped semiconductor material, such as silicon germanium, directly on top of the inner electrode 118. In such cases, the inner electrode 118 may be recessed further than above to accommodate the additional height of growing the semiconductor material on top of the inner electrode 118. Similar configurations to those of the structure 100 in FIG. 3 are envisioned.

In general, the first source-drain 122 and the gate 124 may have an appropriate shape and size to achieve the desired device characteristics while conforming to the structural limitations presented herein. Preferably, the gate 124 may have a shape and size sufficient to form a contact thereto. For example, the ring shape of the gate 124 may have a sufficient thickness to subsequently form an electrical connection. See FIG. 6. As such, a thickness (t) of the ring shape of the gate 124 may or may not be substantially uniform.

Figure 3B:
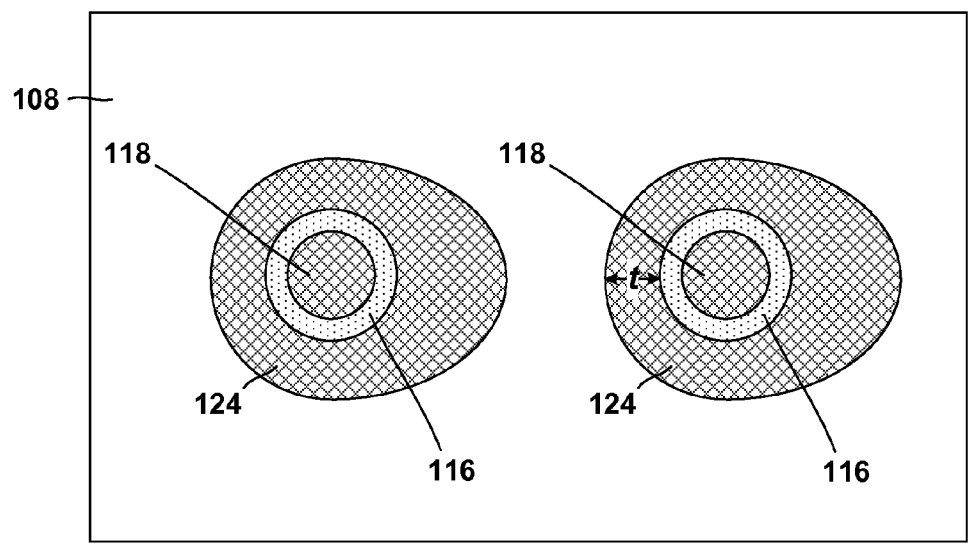
FIG. 3B illustrates a cross section view, section A-A, of FIG. 3 according to an exemplary embodiment.

Referring now to FIG. 3B, a cross section view, section A-A, of FIG. 3 is shown according to another embodiment. In another embodiment, the thickness (t) of the ring shape (FIG. 3A) of the gate 124 may be proportionally thicker in only one area to specifically accommodate the subsequently formed electrical connection to the gate 124.

Figure 3C:
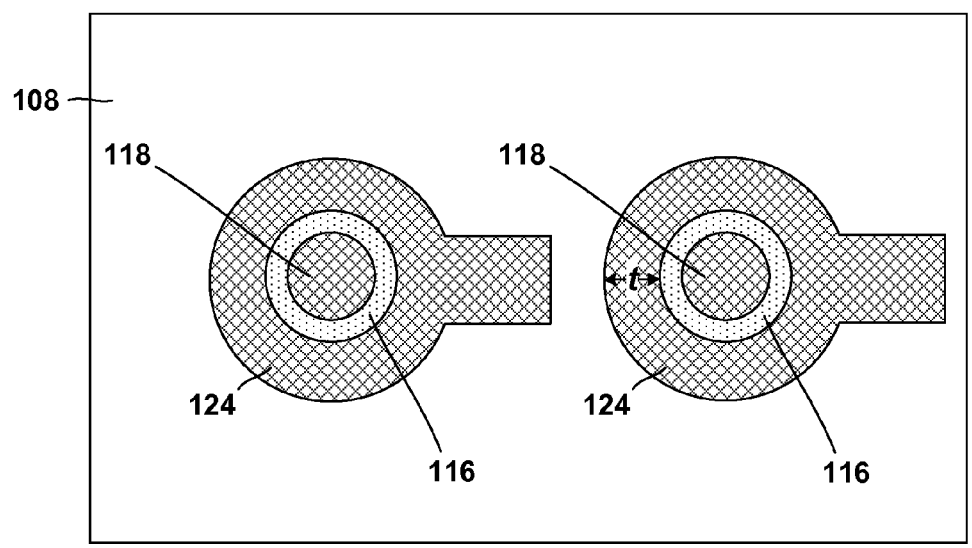
FIG. 3C illustrates a cross section view, section A-A, of FIG. 3 according to an exemplary embodiment.

Referring now to FIG. 3C, a cross section view, section A-A, of FIG. 3 is shown according to another embodiment. In another embodiment, the thickness (t) of the ring shape (FIG. 3A) of the gate 124 may be substantially uniform with the addition of a "leg" or "extension" which may be fabricated specifically to accommodate the subsequently formed electrical connection to the gate 124. The "leg" or "extension" may be fabricated at the same time or subsequently using a similar implant technique as is used to form the gate 124, as described above with reference to FIG. 3.

Figure 4:
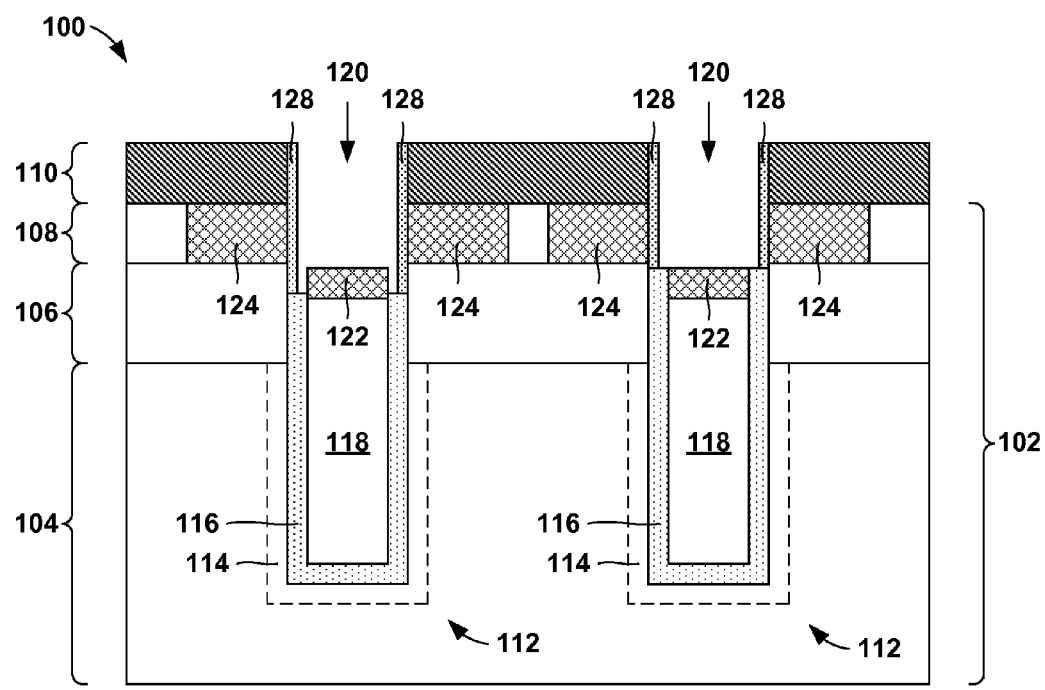

Referring now to FIG. 4, a gate dielectric 128 may be formed along a sidewall of the opening 120, according to known techniques. The gate dielectric 128 can be formed by a deposition process such as, for example, chemical vapor deposition (CVD), plasma-assisted CVD, atomic layer deposition (ALD), evaporation, reactive sputtering, chemical solution deposition or other like deposition processes. Alternatively, the gate dielectric 128 can be formed by a thermal growing process such as, for example, oxidation, nitridation or oxynitridation. The gate dielectric 128 may also be formed using any combination of the above processes.

The gate dielectric 128 may include an insulating material including, but not limited to: an oxide, a nitride, an oxynitride or a silicate including metal silicates and nitrided metal silicates. In an embodiment, the gate dielectric 128 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The thickness of the gate dielectric 128 may vary, but typically may have a thickness ranging from about 0.5 nm to about 10 nm. More preferably the gate dielectric 128 may have a thickness ranging from about 0.5 nm to about 3 nm.

It should be noted that depending on the chosen fabrication technique the gate dielectric 128 may need to be removed from a bottom of the opening 120 to expose the first source-drain 122. Furthermore, the gate dielectric 128 of the present embodiment may extend from an upper surface of the pad nitride layer 110 down to the bottom of the opening 120 in contact with the node dielectric 116. In an embodiment where a thermal growing process is used, the gate dielectric 128 may be aligned only with the SOI layer 108 and neither the buried oxide layer 106 nor the pad nitride layer 110.

Figure 5:
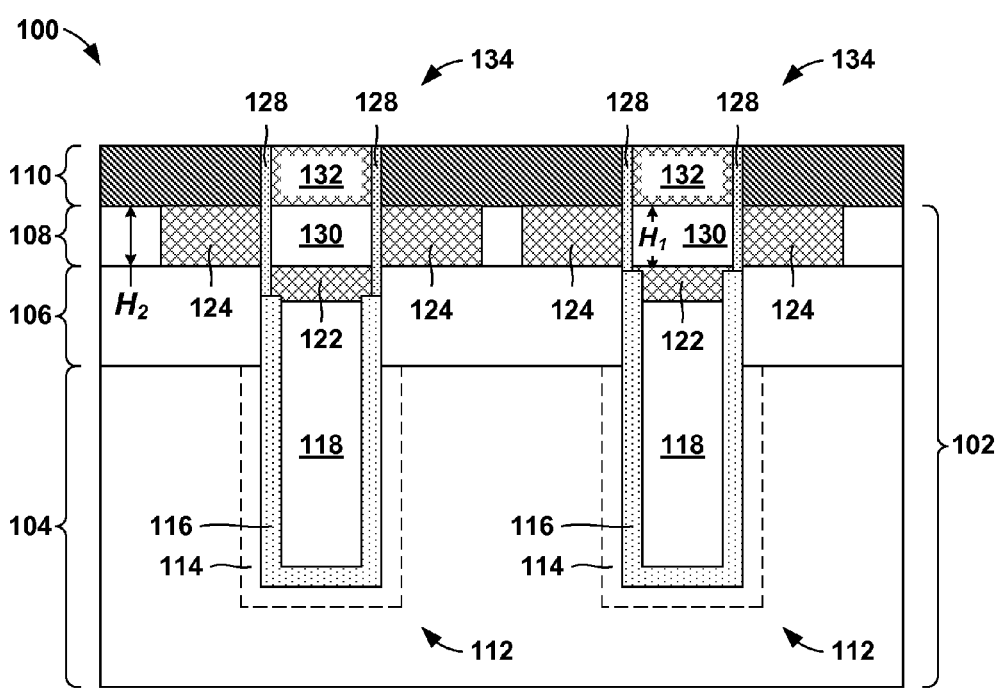

Referring now to FIG. 5, a channel 130 may be formed within the opening 120 (FIG. 4) above and in direct contact with the first source-drain region 122 according to known techniques. The channel 130 may be formed first by filling the opening 120 (FIG. 4) with an un-doped semiconductor material and then recessing the un-doped semiconductor material to a desired depth. The channel 130 may be formed using any known deposition technique such as, for example, chemical vapor deposition (CVD), plasma-assisted CVD, atomic layer deposition (ALD), evaporation, reactive sputtering, chemical solution deposition or other like deposition processes. In an embodiment, the channel 130 may include any un-doped semiconductor material, such as, for example, un-doped polysilicon. Alternatively, the channel 130 may be made from a semiconductor material which may be doped opposite that of the source-drains 122, 132. In general, the channel 130 may have a cylindrical shape extending from the first source-drain 122 up to about the interface between the SOI layer 108 and the pad nitride layer 110. As previously mentioned, it should be noted that the dopants used to create the source-drain 122 may further diffuse into the semiconductor material of the channel 130 expanding its shape and size as illustrated.

In an embodiment, the channel 130 may generally be aligned with the SOI layer 108. More specifically, the channel 130 may generally be aligned with the gate 124. Stated differently, a relative height ($H_1$) of the channel 130 may be about equal to a relative height ($H_2$) of the gate 124. Alternatively, the channel 130 may have a relative height ($H_1$) greater than or less than the relative ($H_2$) height of the gate 124. It should be noted that the relative height ($H_2$) of the gate 124 may be substantially similar to the thickness of the SOI layer 108. Also, it should be noted that the relative height ($H_1$) of the channel 130, may be measured from an upper surface of the first source-drain 122 to a lower surface of a second source-drain (discussed below). Unlike a conventional planar transistor where a gate is positioned directly above a channel, the gate 124 in the present embodiment may preferably surround the channel 130. Also, as with most field effect transistors, the gate dielectric 128 may separate or insulate the gate 124 from the channel 130.

Next, a second source-drain 132 may be formed above and in direct contact with the channel 130, according to known techniques. The second source-drain 132 may be formed using similar techniques as described above with reference to the first source-drain 122. The second source-drain 132 may include a doped semiconductor material similar to that of the first source-drain 122. As mentioned above, the un-doped semiconductor material of the channel 130, in most cases, may be recessed before forming the second source-drain region 132. Also like above, the second source-drain 132 may alternatively be formed by growing a doped semiconductor material, such as, for example, silicon germanium.

With continued reference to FIG. 5, the structure 100 is shown with two completed DRAM cells, one on the left side of the figure and one on the right side of the figure. Each DRAM cell may include a field effect transistor 134 (hereinafter "FET") positioned directly above and vertically aligned to the deep trench capacitor 112. The FET 134 may be alternatively referred to as a vertical pass gate transistor. The FET 134 of the present embodiment may include the first source-drain 122, the second source-drain 132, and the gate 124. In the present embodiment, the FET 134 may be electrically coupled to the deep trench capacitor 112 to form the DRAM cell. More specifically, the inner electrode 118 of the deep trench capacitor 112 may be electrically coupled to the first source-drain 122 of the FET 134.

It should be noted each of the DRAM cells illustrated in FIG. 5 represent two alternative configurations. More specifically, the difference between the alternative configurations relates to recessing the node dielectric 116 and the inner electrode 118, as described above with reference to FIG. 2.

In an embodiment, as illustrated by the DRAM cell on the right side of the figures, the node dielectric 116 and the inner electrode 118 may be recessed to a substantially similar depth. In such cases, the channel 130 may be subsequently formed above and in direct contact with the first source-drain 122. More specifically, a lower surface of the channel 130 may be in direct contact with an upper surface of the first source-drain 122.

In another embodiment, as illustrated by the DRAM cell on the left side of the figures, the node dielectric 116 may be recessed below the inner electrode 118. In such cases, not only the upper surface of the first source-drain 122 may be exposed, but a sidewall may also be exposed. As such, the semiconductor material of the channel 130 can partially wrap around and contact the sidewall in addition to the upper surface of the first source-drain 122; however, as mentioned above, the source-drain 122 may expand to include any semiconductor material of the channel 130 in contact with the sidewall of the source-drain 122.

According to another embodiment, a similar configuration to the DRAM cell depicted on the right side of the figures may be achieved by first recessing the inner electrode 118 deeper than the node dielectric 116 and subsequently forming the first source-drain 122 by growing or depositing a doped semiconductor material on an exposed upper surface of the inner electrode 118.

Figure 6:
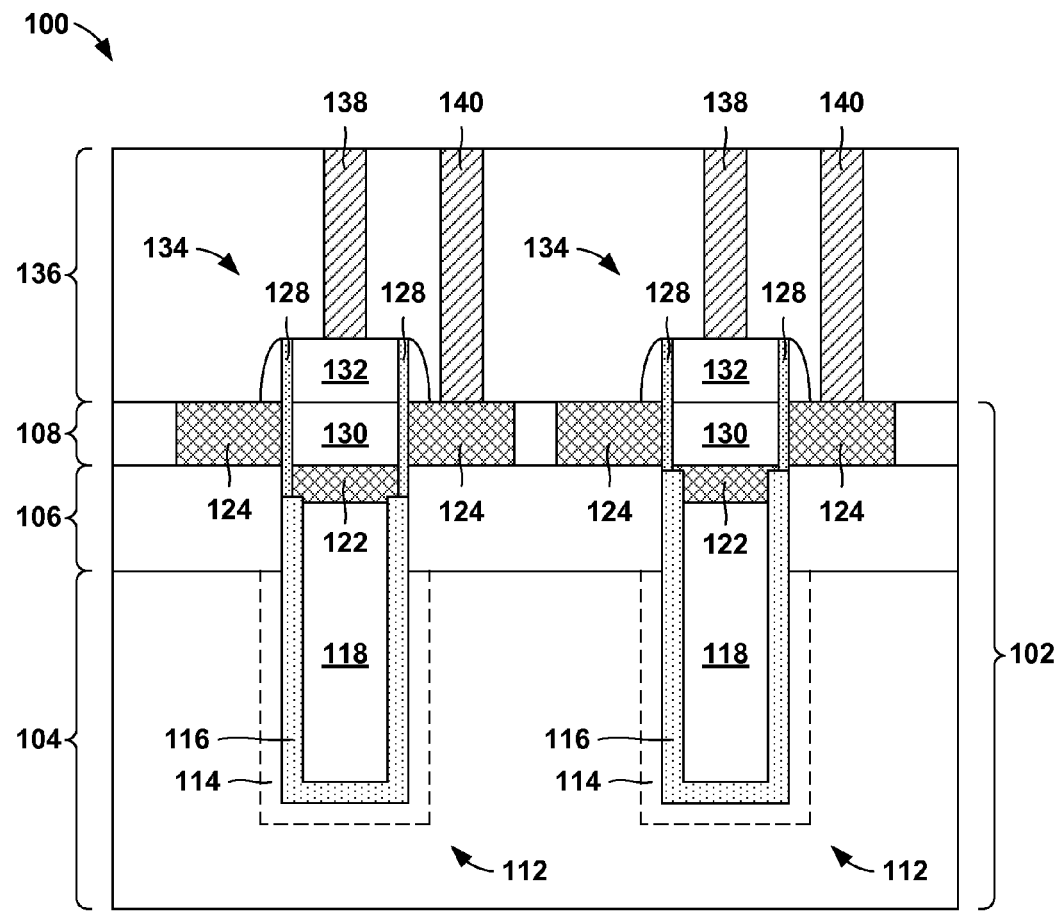

Referring now to FIG. 6, the final structure 100 is shown with a contact-level dielectric 136 deposited on top of the structure above the DRAM cells according to known techniques. In an embodiment, the contact-level dielectric 136 may include, but is not limited to, a material made from, a nitride, an oxide, a carbide, or any combination of these materials. In an embodiment, the contact-level dielectric 136 may include an oxide deposited using a CVD technique. The contact-level dielectric 136 may have a thickness ranging from about 20 nm to 100 nm, although a thickness of the contact-level dielectric 136 less than 20 nm or greater than 100 nm may be acceptable. The contact-level dielectric 136 may be planarized using a chemical mechanical polishing technique after being formed on top of the structure 100.

Next, one or more contact trenches may then be formed by etching through the contact-level dielectric 136 to make electrical connections with the DRAM cells formed in the SOI substrate 102. A first contact trench may extend from a top surface of the contact-level dielectric 136 down to the second source-drain 132. A second contact trench may extend from a top surface of the contact-level dielectric 136 down to the gate 124.

With continued reference to FIG. 6, a conductive material may be deposited to fill the first and second contact trenches and form a first contact 138 and a second contact 140. The conductive material may include any material having a high electrical conductivity. In one embodiment, the conductive material can include, for example, tungsten, copper, aluminum, silver, gold, alloys thereof, and any suitable combination thereof. The conductive material can be deposited by any suitable technique, including but not limited to, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. The thickness, or depth, of the first and second contacts 138, 140 may range from about 20 nm to about 100 nm, although lesser and greater thicknesses may also be contemplated. After deposition, a planarization process, such as, for example, chemical mechanical polishing, may be performed to remove any excess conductive material above the contact-level dielectric 136.

Another embodiment by which to fabricate the vertically integrated DRAM cell is described in detail below by referring to FIG. 7. In the present embodiment, a channel 202 may, in general, have a tubular shape which may be filled with an insulating material, as described below.

Figure 7:
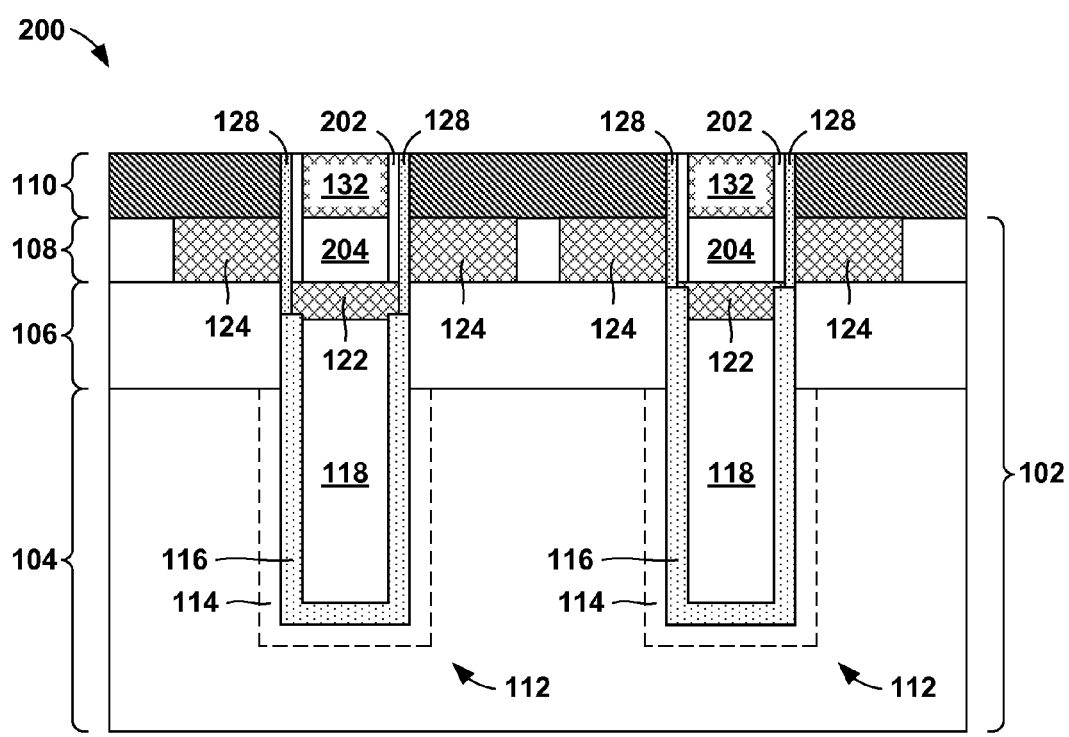
FIG. 7 depicts the vertically integrated DRAM cell according to another exemplary embodiment.

FIG. 7 illustrates a final structure 200 in accordance with embodiments of the present invention. Like above, the figure is a cross section view of a portion of a semiconductor wafer. It should be noted that the following stages of fabrication of the present embodiment described below may generally replace those fabrication stages described above with reference to FIG. 5. As such, the following description may continue after the description of FIG. 4, and subsequently resume with the description of FIG. 6.

Referring now to FIG. 7, the channel 202 may be formed within the opening 120 (FIG. 4) above and in direct contact with the first source-drain region 122 according to known techniques. The channel 202 may be substantially similar to the channel 130 described above with reference to FIG. 5. In the present embodiment, the channel 202 may be formed by conformally depositing a liner having a thickness within the opening 120 (FIG. 4), as illustrated. As such, the channel 202 may have a substantially tubular shape. Like the channel 130 described above, the channel 202 depicted on the left side of the figure may benefit from increase contact area with the first source-drain 122.

After depositing the liner to form the channel 202, an insulating material 204, such as, for example, silicon oxide or other suitable insulating materials, may be deposited to substantially fill the opening 120 (FIG. 4). In the present embodiment, the insulating material 204 may then be recessed selective to the channel 202 according to known techniques in preparation for the formation of the second source-drain 132, as described above. Finally, fabrication of the structure 200 may continue according to the techniques described above with reference to FIG. 6.

Figure 8:
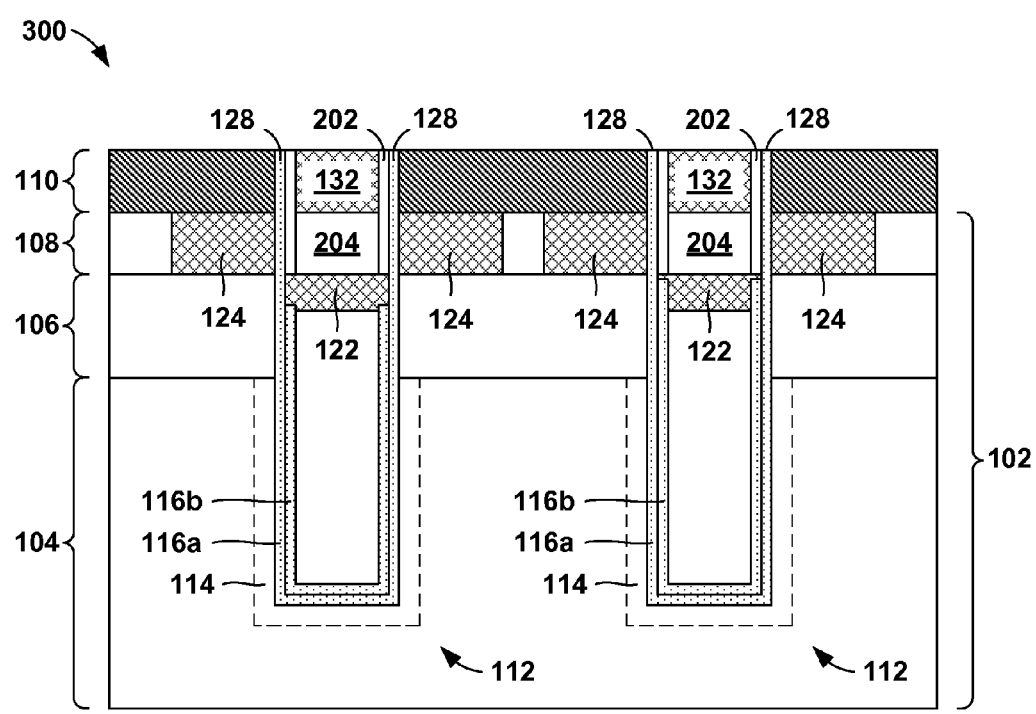
FIG. 8 depicts the vertically integrated DRAM cell according to another exemplary embodiment.

Another embodiment by which to fabricate the vertically integrated DRAM cell is described in detail below by referring to FIG. 8. FIG. 8 illustrates a final structure 300 in accordance with embodiments of the present invention. In the present embodiment, the node dielectric 116 may include more than one layer. More specifically, a barrier layer 116a and a dielectric layer 116b may be deposited within the deep trench to form the node dielectric 116. The barrier layer 116a may include a dielectric material such as silicon oxide, silicon nitride, or silicon oxynitride. The dielectric layer 116b may include, for example, a high-k material having a dielectric constant greater than the dielectric constant of silicon nitride, which is about 7.5, specific examples of which are included above. In the present embodiment, the barrier layer 116a may substantially remain and function as a gate dielectric. In such cases, the gate dielectric 128 described above with reference to FIG. 4 may not be required. The dielectric layer 116b may be recessed and/or configured similar to the node dielectric 116 as described above.

In all embodiments, the FET 134 may be positioned directly above and vertically aligned to the deep trench capacitor 112 to form the vertically integrated DRAM cells. Such a configuration conserves valuable substrate area thereby substantially increasing the possible DRAM cell density.

A typical DRAM cell may generally include a field effect transistor positioned adjacent to a deep trench capacitor. If, for exemplary purposes, a field effect transistor and a deep trench capacitor each consumed the same amount of substrate area, positioning the FET 134 directly above the deep trench capacitor 112, as described in detail above, would reduce the DRAM cells footprint by half.

In addition to saving valuable substrate area, the vertically integrated DRAM cell proposed above may be fabricated in fewer steps than a conventional DRAM cell. Fewer fabrication steps may be achieved by partially embedding the FET 134 within the deep trench as described above. Fewer steps means faster fabrication time and lower fabrication cost. In addition, the embodiments disclosed above are particularly unique in that the channel 130 of the FET 134 is fabricated from polysilicon which is generally not used in typical FET construction for its poor electron mobility leading to poor device performance. In the present case, performance may be sacrificed for increased layout density. Therefore, anyone looking to make a high performance device would not consider polysilicon as a suitable channel material and would otherwise not be inclined to fabricate the structures, or any variation thereof, disclosed above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

What is claimed is:

1. A vertically integrated memory cell comprising:
    a deep trench extending into a semiconductor-on-insulator substrate comprising an SOI layer, a buried oxide layer, and a base layer; the buried oxide layer is located below the SOI layer and above the base layer, and the buried oxide layer electrically insulates the SOI layer from the base layer;
    a trench capacitor located within the deep trench; and
    a vertical transistor at least partially embedded within the deep trench above the trench capacitor, the vertical transistor is in direct contact with and electrically coupled to the trench capacitor, and a gate of the vertical transistor is located within the SOI layer and surrounds the deep trench.

2. The vertically integrated memory cell of claim 1, wherein an upper surface of an inner electrode of the trench capacitor is below a bottom surface of the SOI layer.

3. The vertically integrated memory cell of claim 1, wherein the vertical transistor comprises a channel disposed within the deep trench above and in direct contact with an inner electrode of the trench capacitor, the channel having a generally cylindrical shape.

4. The vertically integrated memory cell of claim 1, wherein the vertical transistor comprises a channel disposed within the deep trench above and in direct contact with an inner electrode of the trench capacitor, the channel having a generally tubular shape.

5. The vertically integrated memory cell of claim 1, wherein the vertical transistor comprises a channel and a source-drain, the channel is disposed within the deep trench above and in direct contact with an inner electrode of the trench capacitor, the source-drain is above and in direct contact with the channel, and extends above the semiconductor-on-insulator substrate.

6. The vertically integrated memory cell of claim 1, wherein the vertical transistor comprises a channel and a source-drain, the channel is disposed within the deep trench above and in direct contact with an inner electrode of the trench capacitor, the source-drain comprises an upper portion of the inner electrode.

7. The vertically integrated memory cell of claim 1, wherein the vertical transistor comprises a channel and a gate dielectric, the channel is disposed within the deep trench above and in direct contact with an inner electrode of the trench capacitor, the gate dielectric is disposed along and in direct contact with a sidewall of the deep trench above the trench capacitor and insulates the channel from the gate, the gate dielectric extends vertically from an uppermost surface of a node dielectric of the trench capacitor to a top surface of the SOI layer.

8. A vertically integrated memory cell comprising:
a deep trench extending into a semiconductor-on-insulator substrate comprising an SOI layer, a buried oxide layer, and a base layer; the buried oxide layer is located below the SOI layer and above the base layer, and the buried oxide layer electrically insulates the SOI layer from the base layer, the deep trench comprising a sidewall and a bottom;
a trench capacitor located within the deep trench, the trench capacitor comprising a node dielectric disposed along the sidewall and the bottom of the deep trench and an inner electrode disposed on top of the node dielectric; and
a vertical transistor at least partially embedded within the deep trench above the trench capacitor, the vertical transistor comprising a channel and a gate, the channel is disposed within the deep trench above and in direct contact with the inner electrode of the trench capacitor, the gate is located within the SOI layer and surrounds the deep trench.

9. The vertically integrated memory cell of claim 8, wherein an upper surface of the inner electrode of the trench capacitor is below a bottom surface of the SOI layer.

10. The vertically integrated memory cell of claim 8, wherein the channel has a generally cylindrical shape.

11. The vertically integrated memory cell of claim 8, wherein the channel is disposed along the sidewall of the deep trench and has a generally tubular shape.

12. The vertically integrated memory cell of claim 8, further comprising:
a source-drain above and in direct contact with the channel, and extending above the semiconductor-on-insulator substrate.

13. The vertically integrated memory cell of claim 8, further comprising:
a source-drain comprising an upper portion of the inner electrode.

14. The vertically integrated memory cell of claim 8, wherein the node dielectric comprises a barrier layer and a dielectric layer, wherein an uppermost surface of the barrier layer is substantially flush with a top surface of a source-drain directly above the channel, and an uppermost surface of the dielectric layer is above a top surface of the base layer and below a top surface of the buried oxide layer.

15. The vertically integrated memory cell of claim 8, further comprising:
a gate dielectric disposed along and in direct contact with the sidewall of the deep trench, the gate dielectric extends vertically from an uppermost surface of the node dielectric to a top surface of the SOI layer and insulates the channel from the gate.

16. A vertically integrated memory cell comprising:
a deep trench extending into a semiconductor-on-insulator substrate, the deep trench comprising a sidewall and a bottom, the semiconductor-on-insulator substrate comprises an SOI layer, a buried oxide layer, and a base layer; the buried oxide layer is located below the SOI layer and above the base layer, and the buried oxide layer electrically insulates the SOI layer from the base layer;
a trench capacitor located within the deep trench, the trench capacitor comprising a barrier layer disposed along an entire sidewall and the bottom of the deep trench, a dielectric layer disposed on top of the barrier layer, and an inner electrode disposed on top of the dielectric layer, an upper surface of the inner electrode is below a bottom surface of the SOI layer, and above a top surface of the base layer; and
a vertical transistor at least partially embedded within the deep trench above the trench capacitor, the vertical transistor comprising a channel and a gate, the channel is disposed within the deep trench above and in direct contact with the inner electrode of the trench capacitor, the gate is located within the SOI layer and surrounds the channel, and the barrier layer of the trench capacitor separates the gate from the channel.

17. The vertically integrated memory cell of claim 16, wherein the channel has a generally cylindrical shape.

18. The vertically integrated memory cell of claim 16, wherein the channel is disposed along the sidewall of the deep trench and has a generally tubular shape surrounding an insulating material directly above the inner electrode and directly below a source-drain.

19. The vertically integrated memory cell of claim 16, further comprising:
a source-drain above and in direct contact with the channel, and extending above the semiconductor-on-insulator substrate.

20. The vertically integrated memory cell of claim 16, further comprising:
a source-drain comprising an upper portion of the inner electrode.

* * * * *